United States Patent [19]

Okajima

[11] Patent Number: 4,697,104
[45] Date of Patent: Sep. 29, 1987

[54] TWO STAGE DECODER CIRCUIT USING THRESHOLD LOGIC TO DECODE HIGH-ORDER BITS AND DIODE-MATRIX LOGIC TO DECODE LOW-ORDER BITS

[75] Inventor: Yoshinori Okajima, Kawasaki, Japan

[73] Assignee: Fujitsu Limited, Kawasaki, Japan

[21] Appl. No.: 737,464

[22] Filed: May 24, 1985

[30] Foreign Application Priority Data

May 31, 1984 [JP] Japan ................... 59-109500

[51] Int. Cl.[4] .................. H03K 19/086; H03K 19/084
[52] U.S. Cl. .................................. 307/463; 307/443; 307/446; 365/230
[58] Field of Search ............... 307/443, 463, 466, 467, 307/446, 449; 365/230; 340/804, 825.53, 825.52

[56] References Cited

U.S. PATENT DOCUMENTS 4,348,747  9/1982  Takahashi ................ 307/465 X
4,349,895  9/1982  Isogai ...................... 365/230
4,355,245 10/1982  Isogai ...................... 307/463 X
4,369,503  1/1983  Isogai ...................... 307/463 X
4,385,370  5/1983  Isogai ...................... 365/230
4,598,390  7/1986  Chan ....................... 365/230

FOREIGN PATENT DOCUMENTS 0054853  6/1982  European Pat. Off. ......... 365/230
146680 11/1980  Japan ....................... 307/463

Primary Examiner—Stanley D. Miller
Assistant Examiner—D. R. Hudspeth
Attorney, Agent, or Firm—Staas & Halsey

[57] ABSTRACT

A two-stage decoder circuit includes a first-stage decoder circuit, for decoding upper bits of an input signal, and a second-stage decoder circuit, which is activated by receiving a selected output signal of the first-stage decoder circuit and which decodes lower bits of the input signal. The first-stage decoder circuit is formed by a threshold-operation type logic circuit which carries out selection or non-selection by comparing the input signal with a predetermined threshold level, and the second-stage decoder circuit is formed by a diode-matrix circuit.

6 Claims, 8 Drawing Figures

TWO STAGE DECODER CIRCUIT USING THRESHOLD LOGIC TO DECODE HIGH-ORDER BITS AND DIODE-MATRIX LOGIC TO DECODE LOW-ORDER BITS

BACKGROUND OF THE INVENTION

1. Field of the Invention

The present invention relates to a two-stage decoder circuit, more particularly, to a two-stage decoder circuit wherein malfunctions caused when an address is changed are eliminated.

2. Description of the Related Art

A multistage decoder circuit is often used as the decoder circuit in a semiconductor integrated circuit (IC) of a semiconductor memory device. Such a multistage decoder circuit can be operated using a small amount of electric power and requires only a few circuit elements. Multistage decoder circuits, however, suffer from double selection and other problems due to the rise of the non-selected output when the address is changed. Therefore, measures must be taken to eliminate these problems.

SUMMARY OF THE INVENTION

An object of the present invention is to provide a two-stage decoder circuit which is free from the problems of double selection, etc.

Another object of the present invention is to provide a two-stage decoder circuit which offers improved reliability of an IC device in which the decoder is used.

A further object of the present invention is to provide a two-stage decoder circuit which does not suffer from a rise in the decoder output when the address is changed.

The above-mentioned objects can be achieved by a two-stage decoder circuit including a first-stage decoder circuit, for decoding upper bits of an input signal, and a second-stage decoder circuit, which is activated by receiving a selected output signal of the first-stage decoder circuit and which decodes lower bits of the input signal. The first-stage decoder circuit is formed by a threshold-operation type logic circuit which carries out selection or non-selection by comparing the input signal with a predetermined threshold level; the second-stage decoder being formed by a so-called diode-matrix circuit.

BRIEF DESCRIPTION OF THE DRAWINGS

Further features and advantages of the present invention will be apparent from the ensuing description with reference to the accompanying drawings in which.

DESCRIPTION OF THE PREFERRED EMBODIMENTS

Figure 1:
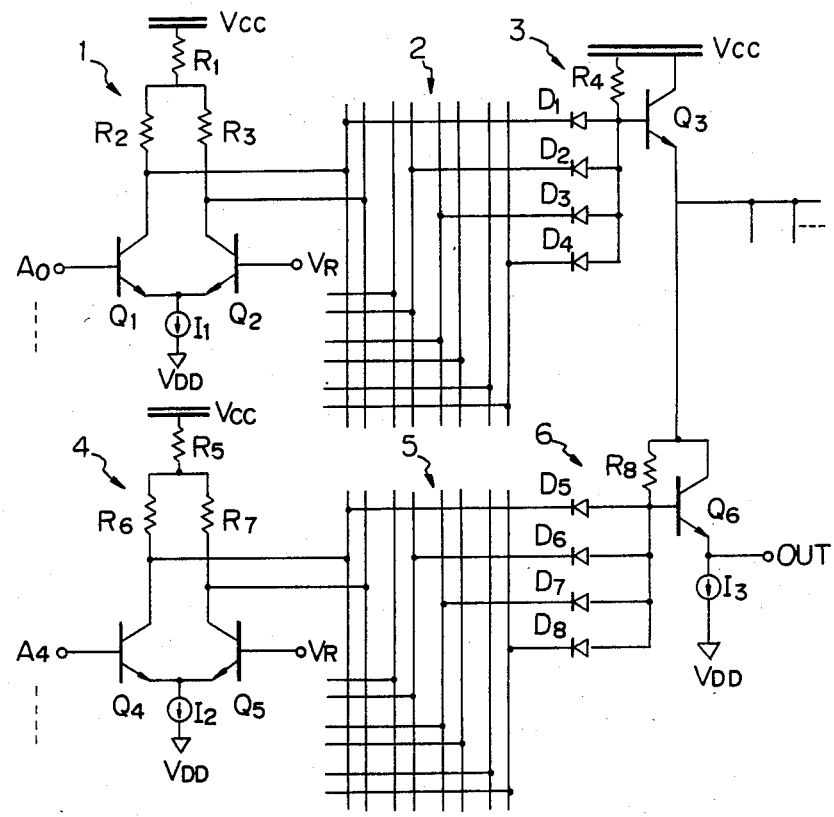
FIG. 1 is a block diagram of a conventional two-stage decoder circuit.

Before describing the preferred embodiments, an explanation will be made of the prior art for reference purposes. FIG. 1 shows an example of a two-stage decoder circuit used in a conventional IC device. In the two-stage decoder circuit shown in FIG. 1, a first-stage decoder circuit is formed by an address buffer 1 for receiving a one-bit address signal $A_0$, etc.; address wires 2 formed by a plurality of signal wires; and AND gates 3. A second-stage decoder circuit includes an address buffer 4, address wires 5 formed by a plurality of signal wires, and AND gate 6.

The address buffer 1 is formed by a differential amplifier including transistor $Q_1$, $Q_2$, the emitters of which are connected with each other. A constant current circuit $I_1$ is connected between the common emitters of these transistors $Q_1$, $Q_2$ and a power source $V_{DD}$. Resistors $R_2$, $R_3$, have one terminal of each connected to the collectors of the transistors $Q_1$, $Q_2$. A resistor $R_1$ is connected between the connected other ends of the resistors $R_2$, $R_3$ and a power source $V_{CC}$.

The address wires 2 include, for example, four pairs of signal wires with an address buffer connected to each pair. In FIG. 1, however, only one address buffer 1 is shown.

The AND gate 3 includes diodes $D_1$, $D_2$, $D_3$, $D_4$, a resistor $R_4$, and a transistor $Q_3$, which are connected between a commonly connected anode of these diodes and the power source $V_{CC}$.

The address buffer 4 in the second-stage address decoder circuit has the same circuit construction as the address buffer 1 with transistors $Q_4$, $Q_5$, a constant current circuit $I_2$, and resistors $R_5$, $R_6$, $R_7$.

The address wires 5 includes four pairs of signal wires, with an address buffer, connected to each pair of signal wires. In FIG. 1, however, only one address buffer 4 is shown.

The AND gate 6 includes diodes $D_5$, $D_6$, $D_7$, $D_8$. A resistor $R_8$ is connected between commonly connected anodes of these diodes and the emitter of the transistor $Q_3$. A transistor $Q_6$ has a collector connected to the emitter of the transistor $Q_3$ and a base connected to commonly connected anodes of diodes $D_5$, $D_6$, $D_7$, $D_8$. A constant current circuit $I_3$ is connected between the transistor $Q_6$ and the power source $V_{DD}$.

In the circuit shown in FIG. 1, the input of the address buffer 1 of the first-stage decoder circuit, that is, the base of the transistor $Q_1$, is supplied with one bit of the address signal. The base of another transistor $Q_2$ is supplied with a reference voltage $V_R$. An inverted address signal $\overline{A}_0$ and non-inverted signal $A_0$ are output at the collectors of each transistor $Q_1$ and $Q_2$ and are supplied to one pair of signal wires in the address wires 2. The other pairs of signal wires in the address wires 2 receive inverted and non-inverted signals of other bits of the address signals from similar address buffers (not shown). Cathodes of the diodes $D_1$, $D_2$, $D_3$, $D_4$ are respectively connected to one of the signal wires in a corresponding pair of signal wires. The address buffers, in the second-stage decoder circuit are similarly supplied with one bit of the address signal and supply inverted and non-inverted address signals to pairs of signal wires in the address wires 5. Further, the output of the first-stage decoder circuit, that is, the emitter of the transistor $Q_3$, is connected with a plurality of second-stage decoder circuits.

In the circuit shown in FIG. 1, when the cathodes of the diodes $D_1$, $D_2$, $D_3$, $D_4$ in the AND gate 3 of the first-stage decoder circuit are all high level, the output of the AND gate 3 becomes high level, so that the emitter of the transistor $Q_3$ becomes high level. Therefore, at this time, when the cathodes of the diodes $D_5$, $D_6$, $D_7$, $D_8$ of the AND gate 6 of the second stage decoder are all high level, the output of the AND gate 6 becomes high level, and the emitter of the transistor $Q_6$, that is, the output signal OUT, becomes high level, so that the word line, etc, are selected.

Conversely, when the output of the first-stage decoder circuit is low level, even if the cathodes of the diodes $D_5$, $D_6$, $D_7$, $D_8$ of the AND gate 6 of the second-stage decoder circuit are all high level, the output OUT becomes low level, that is, the non-selected state.

Further, even if the output of the first-stage decoder circuit is high level, when the output of the AND gate of the second-stage decoder circuit is low level, the output OUT becomes low level, and also in this case, becomes the non-selected state.

Therefore, one merit of this kind of two-stage decoder is that the power consumption is very small. This is because, if the first-stage decoder output is low, none of the second-stage decoder connected to the nonselected first-stage decoders consume power. Only the nonselected second-stage decoders connected to the selected first-stage decoder consume power. Consequently, at any time, only a single group of second-stage decoders connected to the selected first-stage decoder consumes power.

Figure 2:
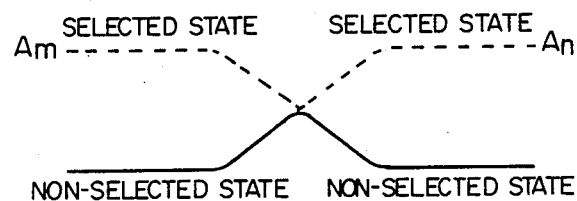
FIG. 2 is a waveform diagram showing a rise of the output signal in the two-stage decoder circuit shown in FIG. 1.

Now, in the conventional two-stage decoder circuit mentioned above, the first-stage decoder circuit and the second-stage decoder circuit are all a matrix type. Therefore, there is the drawback in that the output rises when the address is changed. That is, as shown by the dotted lines in FIG. 2, during the transient state when the address signal Am falls and the address signal An rises, both address signals have an intermediate level. At such a time, when the address is changed, the output of the AND gate, which is in an non-selected state before and after the change of the address, rises as shown by the solid line in FIG. 2. In the circuit illustrated in FIG. 1, since the first-stage decoder circuit and the second-stage decoder circuit have AND gates using diodes, that is, are formed as a matrix type, the rise in the first-stage decoder circuit and the second-stage decoder circuit are superposed, so that a rise is caused at the output OUT. This is because the output level of the diode matrix type AND gate is set at $V_F$ (forward voltage of the diode) from the lowest input level at the cathode of the diode. Therefore, in the conventional circuit shown in FIG. 1, double selection, etc., is caused when the address is changed.

Figure 3:
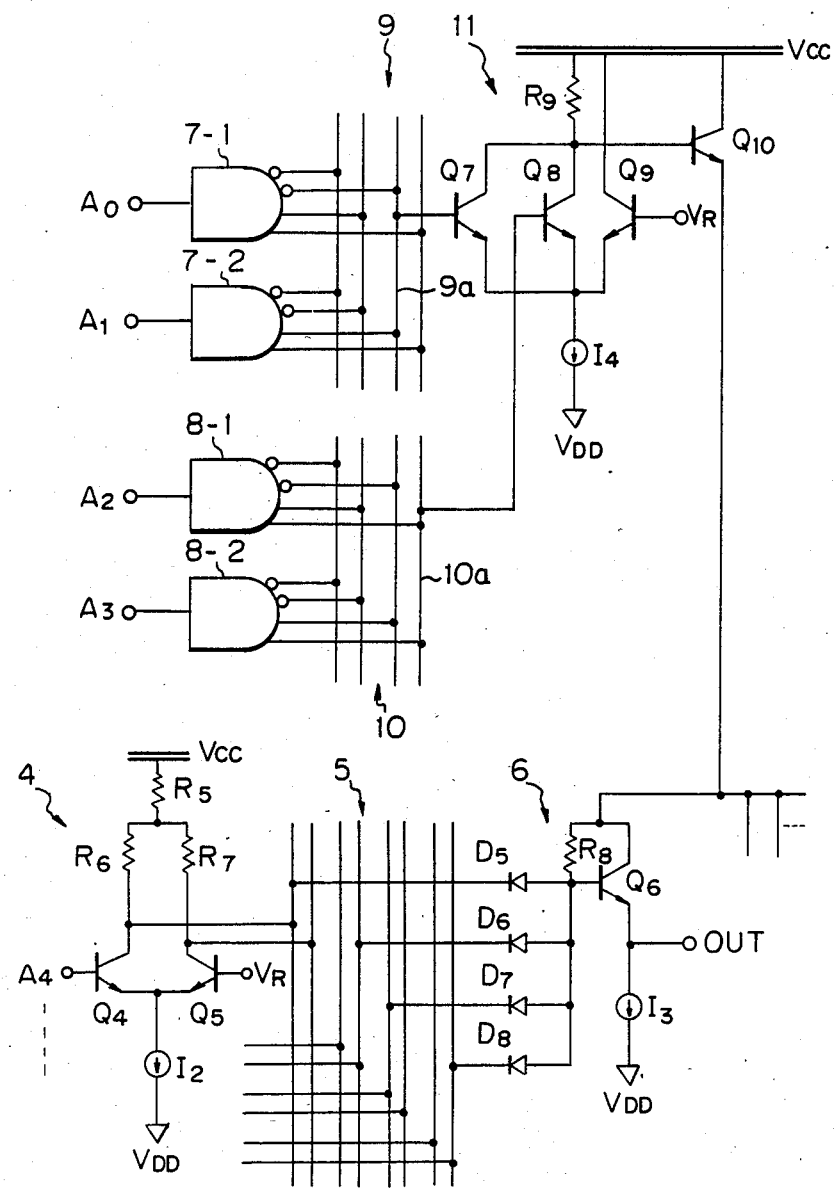
FIG. 3 is a block diagram of one embodiment of a two-stage decoder circuit according to the present invention.

FIG. 3 shows the construction of a two-stage decoder circuit used in an IC device according to one embodiment of the present invention. In the two-stage decoder circuit shown in FIG. 3, a first-stage decoder circuit includes threshold-operation type logic circuits 11, which are different from the diode-matrix type logic circuit. In addition address buffers 7-1, 7-2, and 8-1, 8-2: and address wires 9 and 10 having a plurality of, for example four, signal wires are included.

The address buffers 7-1, 7-2, 8-1, 8-2 in the first-stage decoder receive as input one bit of address signals $A_0$, $A_1$, $A_2$, $A_3$. Each address buffer forms an inverted signal and a non-inverted signal of these address signals and supplies them to the signal wires of the address wires 9 or 10.

The logic circuit 11 includes transistors $Q_7$, $Q_8$, $Q_9$, each having commonly connected emitters. An emitter-follower transistor $Q_{10}$ has a base connected to the commonly connected collectors of the transistors $Q_7$, $Q_8$. Also included are, a load resistor $R_9$ and a constant current source $I_4$. The bases of the transistors $Q_7$, $Q_8$ are respectively connected to one signal line of the address wires 9 and 10. Therefore, for example, 16 logic circuits the same as the logic circuit 11 are provided for energy group of four address buffers, as shown in FIG. 4.

In the circuit shown in FIG. 3, the construction of the second-stage decoder circuit is the same as the circuit shown in FIG. 1 with, the same parts indicated by the same reference symbols. Sixteen AND gates, of the second-stage decoder circuit are connected to the output of the first-stage decoder circuit, for example.

Figure 4:
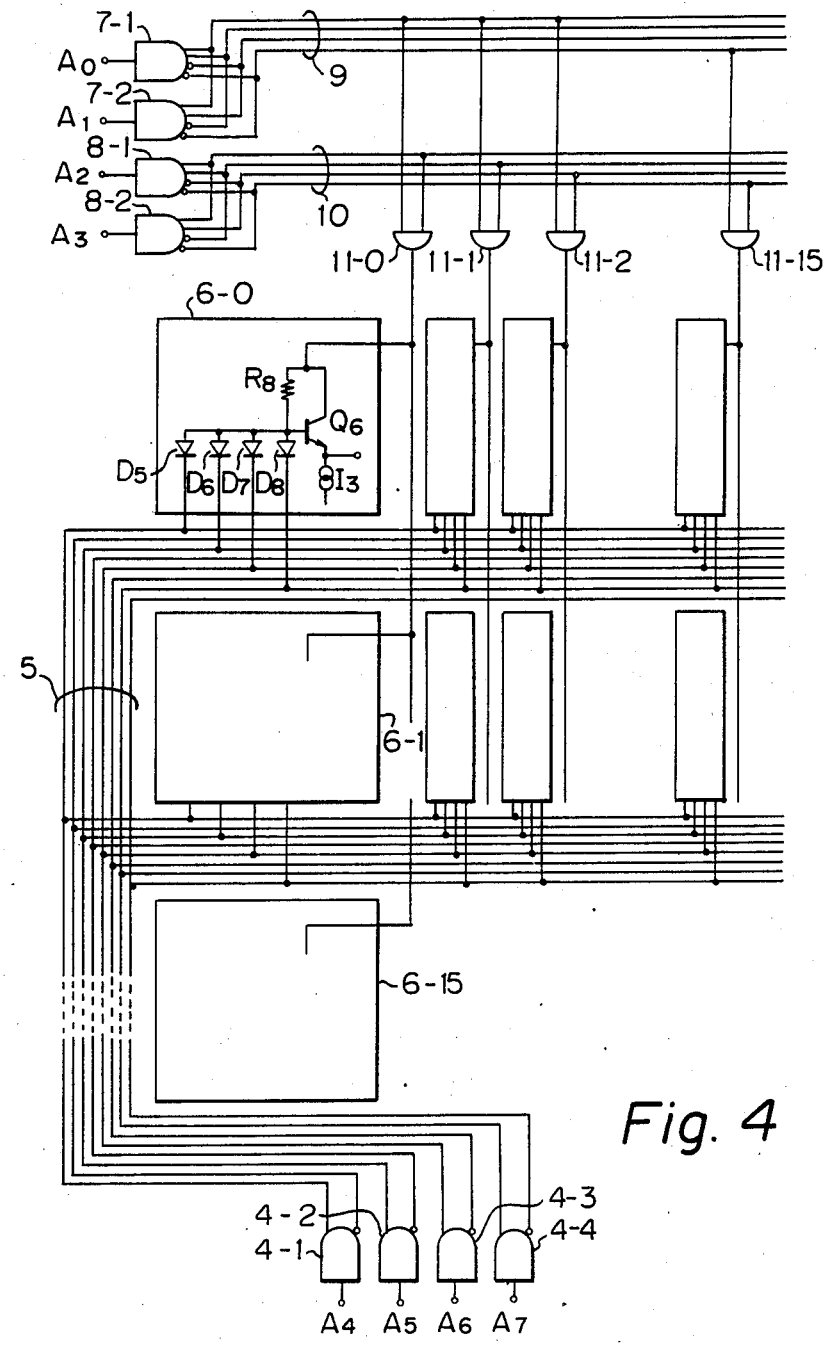
FIG. 4 is a block diagram of a system including the two-stage decoder circuit shown in FIG. 3.

FIG. 4 shows the overall system of the two-stage decoder circuit, wherein the same symbols as in FIG. 3 refer to the same elements. Further, in FIG. 4, 11-0, 11-1, ..., 11-15 designate threshold logic circuits corresponding to 11 in FIG. 3; 6-0, ..., 6-15 designate AND gates corresponding to 6 in FIG. 3; and 4-1, ..., 4-4 designate address buffers corresponding to 4 shown in FIG. 3.

Figure 5:
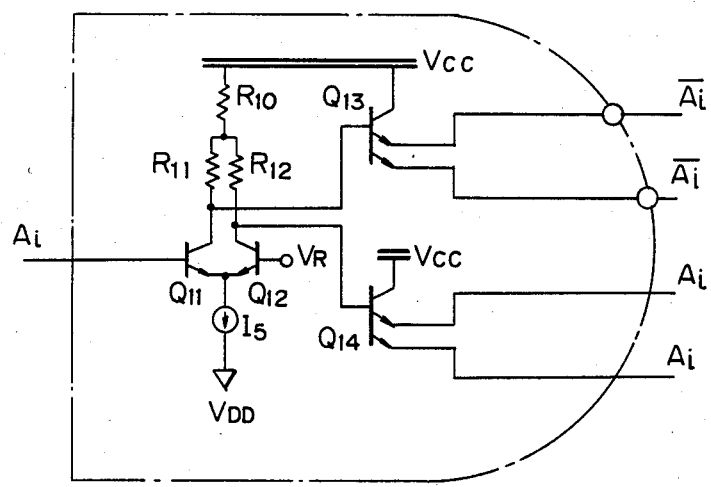
FIG. 5 is detailed circuit diagram of an address buffer used in the two-stage decoder circuit shown in FIG. 3.

FIG. 5 shows a detailed construction of one of the address buffers 7-1, 7-2, 8-1, 8-2 in the circuit shown in FIG. 3. The address buffer shown in FIG. 5 includes a differential amplifier circuit formed by transistors $Q_{11}$, $Q_{12}$ having commonly connected emitters, resistors $R_{10}$, $R_{11}$, $R_{12}$, and a constant current circuit $I_5$ and includes multi-emitter transistors $Q_{13}$ and $Q_{14}$ which form an emitter-follower circuit connected to the collectors of the transistors $Q_{11}$ and $Q_{12}$ of the differential amplifier circuit.

In the address buffer shown in FIG. 5, one bit address signal Ai is supplied to the base of the transistor $Q_{11}$ in the differential amplifier circuit. An inverted address signal and a non-inverted address signal are obtained at the collectors of the transistors $Q_{11}$ and $Q_{12}$. These inverted and non-inverted address signals are supplied, via the emitter-follower circuit formed by the transistors $Q_{13}$ and $Q_{14}$, to each signal wire forming the address wires mentioned above. One emitter of each multi-emitter transistor $Q_{13}$ and $Q_{14}$ in one address buffer is connected to one signal wire, respectively. Therefore, each signal wire in the first-stage decoder circuit in the circuit shown in FIG. 3 is connected with the same number of emitters as address buffers, so that a so-called wired logic type (OR logic type) circuit is formed.

The operation of the two-stage decoder circuit having the above construction will be explained below. In FIG. 3, when one or more of the signals supplied to the signal wires from the address buffers 7-1, 7-2 is high level, the potential of the signal wires of, for example, the address wires 9, becomes high level. Only when both (all) the signals supplied from the address buffers 7-1, 7-2 to the signal wires are low level does the potential become low level. Therefore, the potential of the signal wire 9a connected to the base of the transistor $Q_7$ of the logic circuit 11 becomes low level only when the address signal $A_0$ is high level (for example, "1") and the address signal $A_1$ is low level (for example, "0"). Further, the potential of the signal wire 10a connected to the base of the transistor $Q_8$ becomes low level only when both the address signal $A_2$ is low level and the address signal $A_3$ is low level. The logic circuit 11 operates as a NAND gate. Only when the potentials of the signal wires 9a and 10a are both low level are the transistors $Q_7$ and $Q_8$ cut off and a high level signal output from the emitter of the transistor $Q_{10}$. When any of the input address signals $A_0$, $A_1$, $A_2$, $A_3$ are not in the state mentioned above, one or more of the signal wires 9a and 9b becomes high level and one or more of the transistors $Q_7$ and $Q_8$ becomes on, so that the emitter of the transistor $Q_{10}$ outputs a low level signal.

In the above-mentioned operation, if, when the output of the first-stage decoder circuit becomes high level, all inputs of the AND gates of the second-stage decoder circuit becomes high level, the output OUT becomes high level as mentioned previously and the word line, etc., connected to the output is selected.

Figure 6:
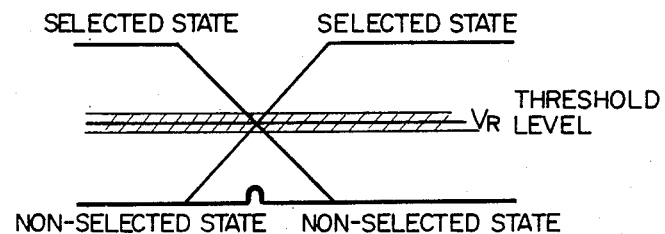
FIG. 6 is a waveform diagram of the output signal in the two-stage decoder circuit shown in FIG. 3.

Now, in the second-stage decoder circuit, for example, only one of four signal wires constituting the address wire 9 is low level; the other three are high level. Even when the address is changed, the potential of only two signal wires at maximum changes; the potential of the other signal wires are maintained at the high level state. Further, as the logic circuit 11 is a threshold-value-operated type NAND circuit, in which the base potential of the transistors $Q_7$ and $Q_8$ is compared with the base potential of the transistor $Q_9$, that is, the reference potential $V_R$ as a threshold value, even when the potential of the signal wire 9a changes from low level to high level and the potential of the signal wire 10a changes from high level to low level, the rise of the output signal can be prevented by setting the reference potential $V_R$ at a suitable value as shown in FIG. 6. That is, the collector level of the transistor $Q_7$, $Q_8$ does not follow the input levels 9a, 10a like the diode-matrix type in FIG. 1. The collector level changes only when all of the input levels become equal or higher than the reference potential $V_R$. Such a condition may exist for a short time at a decoder which changes from the non-selected to the selected state. Further, in a majority of the first stage decoder circuits forming the two-stage decoder circuits, as the potential of the signal wires connected to the input of the logic circuit is held at the high level as mentioned above, a majority of the outputs of the first-stage decoder circuits is maintained at the low level. Therefore, no rise of the output occurs in such decoder circuits.

In summary, in the present invention, since the first-stage decoder is a threshold-operation type logic circuit, the problem of the rise of the output is almost completely resolved. Also, since the second-stage decoders are still diode-matrix types connected to the first-stage decoder, the small power consumption explained before is still maintained.

Figure 7:
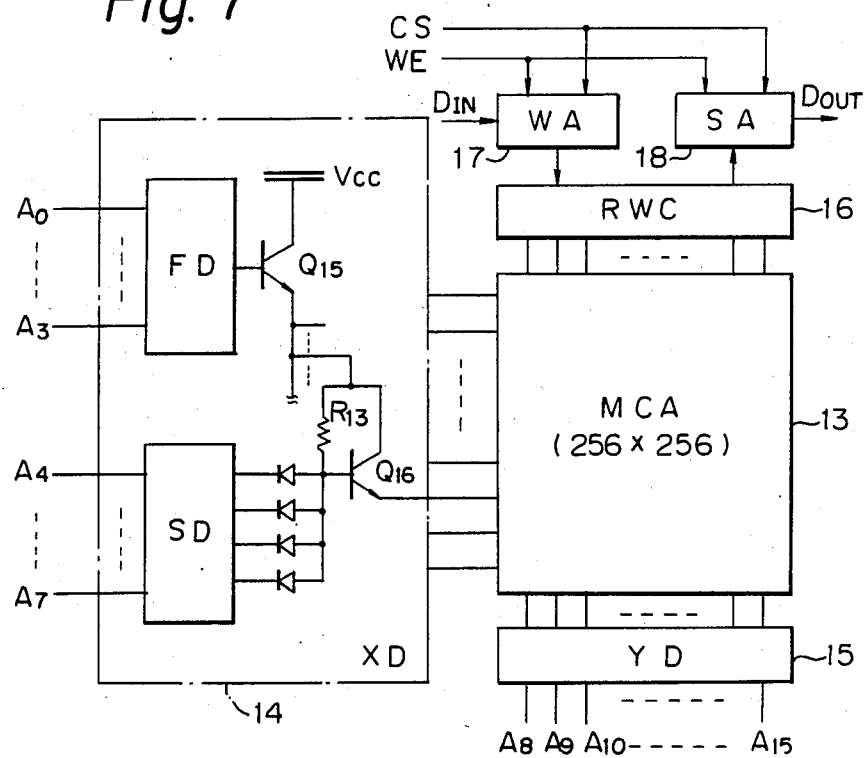
FIG. 7 is a block diagram of a memory device using the two-stage decoder circuit shown in FIG. 3.

FIG. 7 shows an outline of a semiconductor memory device using the two-stage decoder circuit described above. The memory device in FIG. 7 includes a memory cell array 13, an X-decoder 14, a Y-decoder 15, a read/write control circuit 16, a write amplifier 17, a sense amplifier 18, etc. The X-decoder 14 is formed by the two-stage decoder circuit mentioned above. The first-stage decoder circuit FD of the two-stage decoder circuit 14 receives as input the address signals $A_0$, ... $A_3$, and, the second-stage decoder circuit SD receives as input the other four bits of the address signal $A_4$, ... , $A_7$. The X-decoder 14 is used to select one wire from the 256 wires connected to the memory array 13. The Y-decoder receives as input, for example, the 8 bits of address signals $A_8$, $A_9$, ... $A_{15}$. By this Y-decoder, one wire is selected from the 256 wires connected to the memory array 13. Then, the data is written to the memory cell connected to the word line and the bit line selected as mentioned above. That is, when the write enable signal WE has, for example, a high level state so that the memory chip is selected by a chip select signal CS, the write amplifier 17 is enabled, so that the input data $D_{IN}$ is written in the memory cell selected by the write amplifier 17 and the read/write control circuit 16. Further, when the write enable signal WE is low level, the sense amplifier 18 is enabled, so that the data is read from the selected cell by the sense amplifier 18 and the read/write amplifier 16 and is output as the readout data $D_{out}$.

Figure 8:
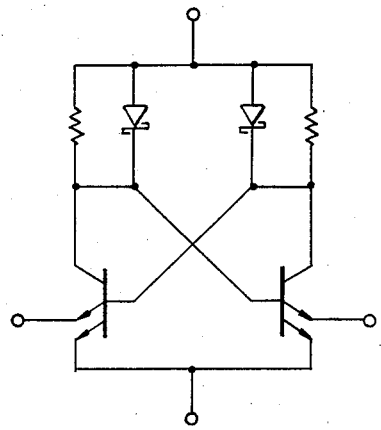
FIG. 8 is a block diagram of one example of the memory cell used in the memory device shown in FIG. 7.

Further, in the memory device shown in FIG. 7, the memory cell shown in FIG. 8 is used. The memory cell shown in FIG. 8 is a so-called diode-load type and is formed by one pair of multi-emitter transistors and one pair of load circuits including a parallel circuit of a diode and a resistor.

As mentioned above, according to the present invention, a decoder circuit using a wired logic circuit is used as the two-stage decoder circuit for a semiconductor memory device. Therefore, the rise of the decoder output when the address is changed is reduced and malfunctions due to double selection, etc., can be prevented. Therefore, it becomes possible to improve the reliability of an IC device using such decoder.

I claim:

1. A two-stage decoder circuit receiving an input signal having upper and lower bits, said two-stage decoder circuit comprising:
    a first-stage decoder circuit, operatively connected to receive the upper bits of the input signal, for producing a first-stage output signal at a first-stage output terminal by decoding the upper bits of the input signal, comprising a threshold operation type logic circuit comparing the upper bits of the input signal with a predetermined threshold level; and
    second stage-decoder circuits, each operatively connected to said first-stage decoder circuit and to receive the lower bits of the input signal and activated by the output signal of said first-stage decoder circuit, for decoding the lower bits of said input signal to produce a selection signal, each of said second-stage decoder circuits comprising:
    impedance means, having a first terminal operatively connected to the first-stage terminal and having a second terminal, for impeding transmission of the first-stage output signal;
    diode means, having inputs operatively connected to receive the lower bits of the input signal and an output operatively connected to the second terminal of said impedance means, for producing the selection signal at the second terminal of said impedance means; and
    a second-stage output terminal operatively connected to the second terminal of said impedance means for outputting the selection signal.

2. A two-stage decoder circuit according to claim 1, wherein
    said first-stage decoder circuit further comprises first address means for generating a first address signal, having bits, in dependence upon at least two of the upper bits of the input signal, and said threshold-operation type logic circuit comprises a plurality of emitter-coupled transistors, one of said emitter-coupled transistors having a base operatively connected to receive the predetermined threshold level and the others of said emitter-coupled transistors each having a base operatively connected to receive one of the bits of the first address signal.

3. A two-stage decoder circuit according to claim 2, wherein
said second-stage decoder circuit further comprises second address means for generating a second address signal, having bits, from the lower bits of the input signal, and
said diode means comprises:
a plurality of diodes, each diode having a cathode operatively connected to receive one of the bits of the address signal and an anode operatively connected to the second terminal of said impedance means; and
a transistor, having a collector operatively connected to the first-stage output terminal, a base operatively connected to the second terminal of said impedance means and an emitter producing an output bit of said two-stage decoder circuit.

4. A two-stage decoder circuit receiving an input signal having upper and lower bits, said two-stage decoder circuit comprising:
a first-stage decoder circuit, operatively connected to receive the upper bits of the input signal, utilizing threshold-operation type logic to produce a first selection signal in dependence upon at least two of the upper bits of the input signal; and
a second-stage decoder circuit, operatively connected to receive the lower bits of the input signal and the first selection signal, utilizing diode-matrix type logic to produce a second selection signal to be output from said two-stage decoder circuit, in dependence upon the lower bits of the input signal and the first selection signal.

5. A two-stage decoder circuit according to claim 4, further comprising power supply means for supplying power, and
wherein said first-stage decoder circuit comprises:
a first transistor having a collector and an emitter both operatively connected to said power supply means and having a base operatively connected to receive a predetermined threshold voltage;
second and third transistors having collectors operatively connected to said power supply means via a common junction, emitters commonly connected to the emitter of said first transistor and bases operatively connected to receive corresponding upper bits of the input signal; and
a fourth transistor having a collector operatively connected to said power supply means, a base operatively connected to the common junction of the collectors of said second and third transistors and an emitter operatively connected to said second-stage decoder circuit for supplying the first selection signal thereto.

6. A two-stage decoder circuit according to claim 5, wherein said second-stage decoder circuit comprises:
a fifth transistor having a collector operatively connected to the emitter of said fourth transistor, an emitter for producing the second selection signal and a base;
diodes having anodes operatively connected to the base of said fifth transistor and cathodes operatively connected to receive corresponding lower bits of the input signal; and
impedance means, operatively connected between the collector and the base of said fifth transistor, for providing an impedance to electrical current flowing between the collector and the base of said fifth transistor.

* * * * *